(12) United States Patent
Pentakota et al.

(10) Patent No.: US 10,566,930 B2
(45) Date of Patent: Feb. 18, 2020

(54) DYNAMICALLY CONTROLLING A NEGATIVE IMPEDANCE OF A VOLTAGE CONTROLLED OSCILLATOR

(71) Applicant: Silicon Laboratories Inc., Austin, TX (US)

(72) Inventors: Krishna Pentakota, Austin, TX (US); Aslamali Rafi, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 225 days.

(21) Appl. No.: 15/498,937

(22) Filed: Apr. 27, 2017

(65) Prior Publication Data

US 2018/0316310 A1 Nov. 1, 2018

(51) Int. Cl.
*H03L 5/00* (2006.01)
*H03B 5/12* (2006.01)
*H03F 3/19* (2006.01)

(52) U.S. Cl.
CPC ......... *H03B 5/1234* (2013.01); *H03B 5/1212* (2013.01); *H03B 5/1228* (2013.01); *H03B 5/1243* (2013.01); *H03B 5/1265* (2013.01); *H03F 3/19* (2013.01); *H03F 2200/294* (2013.01); *H03F 2200/451* (2013.01)

(58) Field of Classification Search
CPC .. H03B 5/1234; H03B 5/1265; H03B 5/1243; H03B 5/1228; H03B 5/1212; H03F 3/19; H03F 2200/294; H03F 2200/451
USPC ...... 331/17 R, 117 FE, 132, 167, 117 R, 109
See application file for complete search history.

(56) References Cited

U.S. PATENT DOCUMENTS

| | | | |
|---|---|---|---|
| 8,120,440 B2* | 2/2012 | Craninckx | H03B 5/1215 331/117 FE |
| 9,401,724 B1* | 7/2016 | Gao | H03B 1/00 |
| 9,608,569 B2* | 3/2017 | Asuri | H03F 1/3205 |
| 2007/0132522 A1* | 6/2007 | Lee | H03B 5/1228 331/167 |
| 2010/0225407 A1* | 9/2010 | Goyal | H03B 19/00 331/117 FE |
| 2011/0227651 A1 | 9/2011 | Hurwitz et al. | |
| 2014/0292301 A1* | 10/2014 | Lee | H03B 5/1228 323/299 |
| 2015/0180414 A1* | 6/2015 | Lee | H03B 7/06 327/157 |

OTHER PUBLICATIONS

Author: Sanduleanu et al.; Title: 1GHz tuning range, low phase noise, LC oscillator with replica biasing common-mode control and quadrature outputs; Date of Conference: Sep. 18-20, 2001; Date added to IEEE Xplore: Aug. 1, 2005; Publisher: IEEE (Year: 2005).*

(Continued)

*Primary Examiner* — Richard Tan
(74) *Attorney, Agent, or Firm* — Egan Peterman Enders Huston

(57) ABSTRACT

In one embodiment, an apparatus includes a voltage controlled oscillator (VCO) to output an oscillating signal. The VCO may have a tank formed of at least one capacitor coupled in parallel with at least one inductor, and a plurality of transconductors to provide energy to the tank. At least one of the plurality of transconductors can be controllably switched to be coupled to the tank or to be decoupled from the tank.

18 Claims, 9 Drawing Sheets

(56) References Cited

OTHER PUBLICATIONS

Khurram Waheed, et al., "A Low Power Frequency Synthesizer With an Integrated Negative Transconductance LC-Tuned VCO," 2003, Oct. 2003, pp. 582-587.

Axel D. Berny, et al., "A 1.8-GHz LC VCO With 1.3-GHz Tuning Range and Digital Amplitude Calibration," IEEE Journal of Solid-State Circuits, vol. 40, No. 4, Apr. 2005, 9 pages.

Jishnu Bhattacharjee, et al. "5.8 GHz Fully Integrated Lo* Power Low Phase Noise CMOS LC VCO for WLAN Applications," 2002 IEEE Radio Frequency Integrated Circuits Symposium, 4 pages.

Seok-Ju Yun, et al., "A 1mW Current-Reuse CMOS Differential LC-VCO with Low Phase Noise," 2005 IEEE International Solid-State Circuits Conference, 3 pages.

* cited by examiner

DYNAMICALLY CONTROLLING A NEGATIVE IMPEDANCE OF A VOLTAGE CONTROLLED OSCILLATOR

BACKGROUND

In many applications, it is desirable to provide a source of oscillation such as a voltage controlled oscillator that can operate at low power levels and with sufficient tuning range to cover an entire radio band (e.g., from 2.4 gigahertz (GHz) to 2.5 GHz) across all process and temperature corners. However there are tradeoffs between providing desired phase noise performance while being optimized for power that current techniques do not sufficiently address.

SUMMARY OF THE INVENTION

In one aspect, an embodiment includes an apparatus comprising a voltage controlled oscillator (VCO) to output an oscillating signal. The VCO may have a tank formed of at least one capacitor coupled in parallel with at least one inductor, and a plurality of transconductors to provide energy to the tank. At least one of the plurality of transconductors may be controllably switched to be coupled to the tank or to be decoupled from the tank.

In an embodiment, the plurality of transconductors comprises at least one fixed transconductor to be fixably coupled to the tank. The apparatus may further include a detection circuit coupled to receive the oscillating signal, where the detection circuit is, based at least in part on at least one operating parameter of the oscillating signal, to control switching of the at least one switchable transconductor. The detection circuit may cause the at least one switchable transconductor to be coupled to the VCO when a swing of the oscillating signal is less than a threshold. The apparatus may further comprise a process monitor coupled to receive the oscillating signal, where the process monitor is, based at least in part on at least one operating parameter of the oscillating signal, to control switching of the at least one switchable. transconductor.

In an embodiment, the at least one switchable transconductor comprises: a first pair of cross-coupled transistors; a second pair of cross-coupled transistors; at least one first switch to controllably couple or decouple the first pair of cross-coupled transistors with respect to the VCO; and at least one second switch to controllably couple or decouple the second pair of cross-coupled transistors with respect to the VCO. The at least one first switch may include a first pair of cascodes coupled to the first pair of cross-coupled transistors, and the at least one second switch may include a second pair of cascodes coupled to the second pair of cross-coupled transistors. The at least one first switch and the at least one second switch can be independently controlled.

In an example, the apparatus may further comprise a voltage regulator to provide an operating voltage to the VCO, where the voltage regulator is to dynamically adjust the operating voltage based at least in part on at least one operating parameter of the oscillating signal. The voltage regulator may comprise a replica circuit to track a process corner of the VCO.

In another aspect, a method comprises: measuring at least one operating parameter of a VCO; and in response to the at least one operating parameter varying from a threshold range, coupling at least one controllable transconductor slice to the VCO. In an embodiment, the method further comprises dynamically controlling an output voltage of a voltage regulator coupled to the VCO in response to the at least one operating parameter varying from the threshold range. The method may further comprise accessing a table based at least in part on a swing of an output signal of the VCO to obtain a control code from the table. The method may further comprise controlling one or more switches of the at least one controllable transconductor slice based on the control code to couple the at least one controllable transconductor slice to the VCO.

In an embodiment, the method may further comprise decoupling the at least one controllable transconductor slice from the VCO in response to the at least one operating parameter being within the threshold range. The method may further comprise maintaining a fixed transconductor slice coupled to the VCO, regardless of a value of the at least one operating parameter. Note that coupling the at least one controllable transconductor slice may comprise: controlling at least one first switch of the at least one controllable transconductor slice to couple a first cross-coupled pair of transistors of the at least one controllable transconductor slice to the VCO; and controlling at least one second switch to maintain a second cross-coupled pair of transistors of the at least one controllable transconductor slice decoupled from the VCO.

In yet another aspect, a system comprises: an amplifier to receive a radio frequency (RF) signal and amplify the RF signal; a mixer to downconvert the amplified RF signal to a second frequency signal according to a mixing signal; a digitizer to digitize the second frequency signal into a digitized signal; a signal processor to process the digitized signal; and a VCO to output an oscillating signal, the mixing signal based on the oscillating signal.

In an embodiment, the VCO may comprise: a tank formed of at least one capacitor coupled in parallel with at least one inductor; and a plurality of transconductors to provide energy to the tank, at least one of the plurality of transconductors to be switchably coupled to the tank or decoupled from the tank based at least in part on one or more of a process corner of the system and an operating parameter of the VCO. The system may further comprise a detection circuit to receive the oscillating signal and detect the operating parameter of the VCO based thereon, where the detection circuit is to control switching of the at least one transconductor based on the detected operating parameter of the VCO.

DETAILED DESCRIPTION

Figure 1:
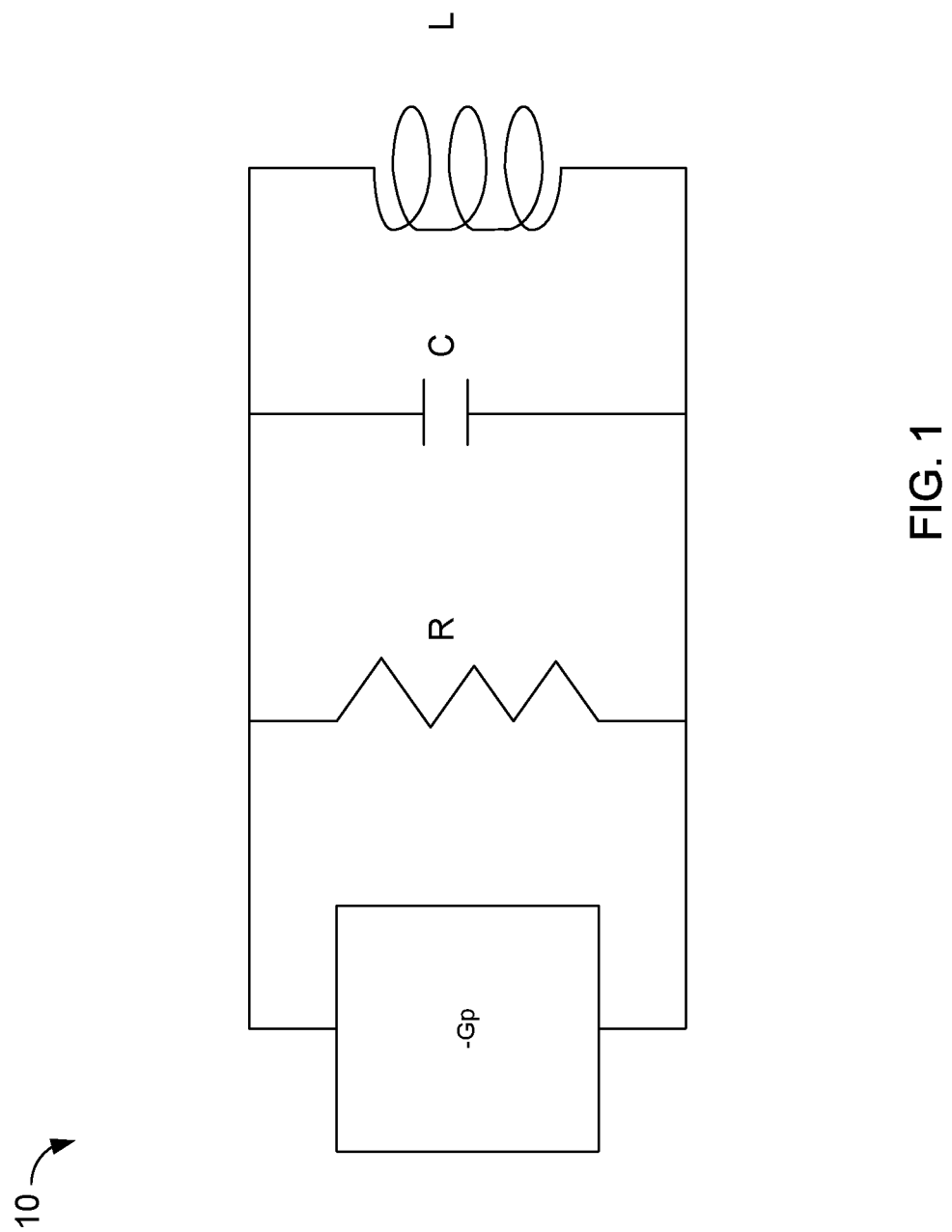
FIG. 1 is a schematic diagram illustrating a model of an LC voltage controlled oscillator (VCO).

Referring now to FIG. 1, shown is a schematic diagram illustrating a model of an LC voltage controlled oscillator (VCO). As illustrated, a VCO 10 is formed of a tank having a capacitance C coupled in parallel with an inductance L. When the LC tank is excited with energy it tends to oscillate at an oscillation frequency defined by $$\frac{1}{2\pi\sqrt{LC}}.$$

Here inductor L and capacitor C have inherent loss mechanisms due to which the oscillations die out. As further shown, a resistance R is illustrated as being coupled in parallel with the tank. This resistance R models losses due to inherent loss mechanisms that, without a supply of energy, cause the oscillation output by the LC tank to subside.

To resolve this condition and to keep the tank oscillating, energy may be supplied to the tank equal to the lost energy. VCO 10 is provided with a negative impedance, −Gp, to provide energy to the LC tank to enable continued oscillation at a desired operating frequency. In an embodiment, this negative impedance may be in the form of a transconductance. Negative impedance (−Gp) supplies the energy dissipated by the losses in the L and C of the LC tank. The condition for sustained oscillations is Gp>=GL (1/w*L*Q), where w is the frequency of operation and Q is the quality factor of the inductor, where GL is 1/R where R is the parallel resistance presented by the tank at a given operating frequency. Understand while shown at this high level to model the arrangement of a LC VCO, a particular implementation may include other components.

Figure 2:
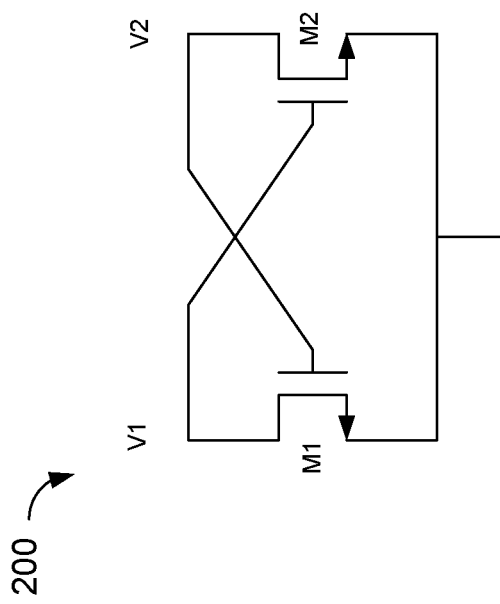
FIG. 2 is a schematic diagram of one arrangement of a transconductor in accordance with an embodiment.

Referring now to FIG. 2, shown is a schematic diagram of one arrangement of a transconductor in accordance with an embodiment. As illustrated, transconductor 200 is implemented as a cross-coupled pair of transistors, namely metal oxide semiconductor field effect transistors (MOSFETs) M1 and M2. In the embodiment of FIG. 2 transconductor 200 is formed of N-channel MOSFETs (NMOS) M1 and M2. Transistors M1 and M2 are cross-coupled, such that a drain terminal of MOSFET M1 couples to a gate terminal of MOSFET M2 and a drain terminal of MOSFET M2 couples to a gate terminal of MOSFET M1. Note that the source terminals are commonly coupled, e.g., to a ground reference node in the embodiment of FIG. 2. As seen in FIG. 2, transconductor 200 does not have a tail current source.

Figure 3:
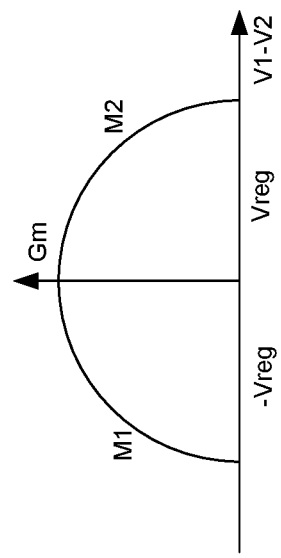
FIG. 3 is a graphical representation of energy that is provided via a transconductor arrangement in accordance with an embodiment.

Referring now to FIG. 3, shown is a graphical representation of energy that is provided via a transconductor arrangement in accordance with an embodiment. As illustrated, the curve in FIG. 3 is of transconductance (gm) versus voltage (V). As illustrated in FIG. 3, the energy replenished to the tank is proportional to the area under the gm vs. V curve. The area under the curve also sets the amplitude of oscillation across the LC tank.

Figure 4:
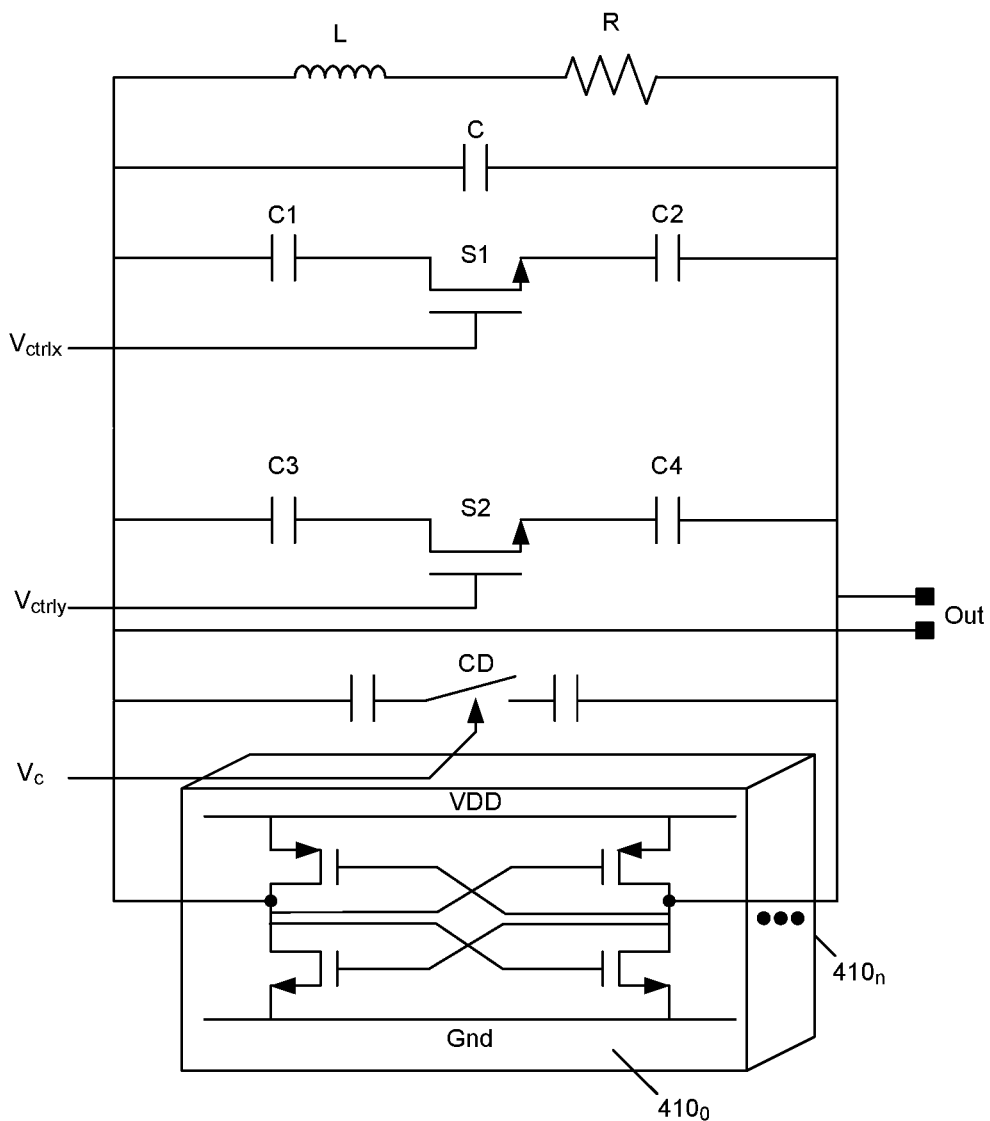
FIG. 4 is a schematic diagram of a VCO in accordance with an embodiment.

To leverage a more power efficient design for a VCO, embodiments may implement a transconductor having a plurality of individual transconductor elements or so-called slices. By way of this slice arrangement, a selectable number of individual transconductors can be coupled into a circuit, to enable a desired amount of energy to be provided to the LC tank of a VCO, while at the same time reducing power consumption with minimal phase and other noise. Referring now to FIG. 4, shown is a schematic diagram of a VCO in accordance with an embodiment. As shown in FIG. 4, VCO 400 includes a transconductor arrangement formed of multiple individual transconductors $410_0$-$410_n$ (generically transconductor 410). As illustrated, each of these transconductors may be formed of multiple pairs of cross-coupled transistors, namely a cross-coupled pair of NMOS devices and a cross-coupled pair of PMOS devices. As described further herein, each of these individual transconductors 410 may be controlled to be coupled to VCO 400 or decoupled from VCO 400. Note in particular embodiments however, a single fixed transconductor may be included such that this fixed single transconductor device is always part of the circuit of VCO 400. Of course while this arrangement is possible in one embodiment, it is possible in other implementations to provide more than one fixed transconductor device. And of course in other cases it is possible to implement the slice-based transconductor arrangement in which all of the available transconductor devices are dynamically controllable to be coupled to or decoupled from the VCO.

As further illustrated, VCO 400 includes an LC tank formed of an inductance L coupled in series with a capacitance. As one example, VCO 400 may be used for a frequency synthesizer in a Wi-Fi transceiver. Of course VCO 400 may have utility in many different applications. The on-chip inductor L may have a finite Q factor and it can have losses from eddy currents in the substrate, finite resistance of the metal used to build the inductor, the finite quality of the parasitic capacitance across the inductor and some losses due to proximity to nearby circuitry.

Various controllable capacitors as in FIG. 4 may compensate for frequency changes due to temperature and process corners, which can vary the amount of capacitance. In the implementation shown in FIG. 4, this capacitance is formed of a fixed capacitance C, which in an embodiment may be implemented as parasitic or inherent capacitance. Note that fixed capacitor C can center the frequency of oscillation to a desired oscillation frequency (e.g., 9.8 GHz) for a typical corner device. An analog varactor is also provided having switchable capacitors C1-C4. Coupling of these capacitors can be controlled by switches S1 and S2 (which in an embodiment may be implemented as NMOS devices that are controlled by control signals Vctrlx and Vctrly). Still further, the capacitance may further be implemented by a digital capacitance $C_D$ which may be formed as a digital capacitor array having multiple digital switches each of which may be independently controlled in response to a control signal (e.g., a given bit of a multi-bit control signal, $V_C$) to adjust the oscillation frequency higher or lower. Note further the presence of a series-coupled resistor R, which models losses inherent in the VCO.

Accordingly, VCO 400, in response to the various control signals that control an amount of capacitance of the LC tank, generates an output signal, which in the embodiment shown is a differential output signal, e.g., a differential clock signal, Out, at a given operating frequency. Thus as described, the various components in VCO 400 have losses associated with them and the total loss presented can vary with temperature, frequency of operation, and process corner. Along with changes in loss, the gm of transconductor 410 can itself change significantly across process, voltage and temperature (PVT). In conventional designs, to guarantee sustained oscillations across all process corners and temperatures, the typical process corner is generally overdesigned by using a zero-crossing gm for the cross-coupled pair that is on the order of 3-4× the total loss in the typical corner. However, this conventional solution to provide a much larger transconductor than required for typical corner devices causes an undesired increase in the power consumption of the VCO.

Thus in various embodiments, to reduce the power consumption and amount of over-design necessary to operate reliably across all corners, controllable transconductor arrangement 410 is provided, which can be used to increase the zero-crossing gm and the startup gain of the oscillator by selectively coupling more transconductor slices. As described further herein, different control techniques are possible to selectively control a number of the individual transconductors 410 for coupling to VCO 400.

Note also that VCO 400 is coupled to receive a regulated supply from a voltage regulator (not shown in FIG. 4). To reduce the variation of the transconductance, the regulator output voltage can be based off a sum of NMOS and PMOS device thresholds. A regulator in accordance with an embodiment may also have programmability features, to tighten the variation of the tranconductance across all corners.

Figure 5:
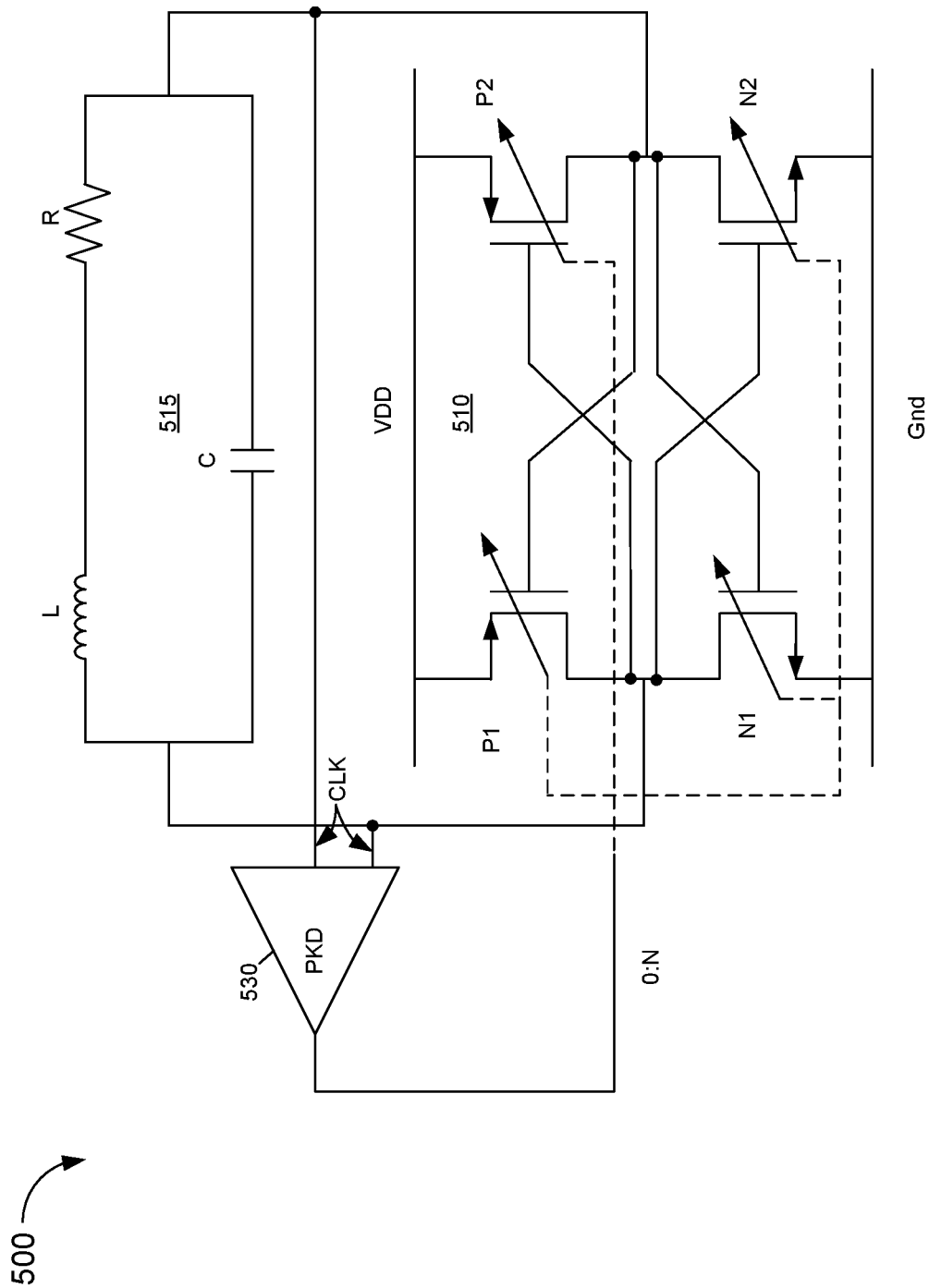
FIG. 5 is a schematic diagram of one embodiment for controlling a transconductor in accordance with an embodiment.

Referring now to FIG. 5, shown is a schematic diagram of one embodiment for controlling a transconductor in accordance with an embodiment. More specifically, in FIG. 5, while VCO 500 includes multiple transconductor slices, only a representative slice (transconductor 510) is shown for ease of illustration. In the embodiment shown, transconductor 510 is formed of pairs of cross-coupled devices, namely cross-coupled NMOS devices N1 and N2 and cross-coupled PMOS devices P1 and P2. As illustrated, cross-coupled PMOS devices P1 and P2 have commonly coupled source terminals that couple to a supply voltage node (e.g., VDD) and commonly coupled drain terminals that couple to output nodes of VCO 500 (and to which the cross-coupled gate terminals of PMOS devices P1 and P2 and NMOS devices N1 and N2 couple). Similarly, cross-coupled NMOS devices N1 and N2 have commonly coupled source terminals that couple to a reference voltage node (e.g., ground) and commonly coupled drain terminals that couple to the output nodes.

As further illustrated, VCO 500 further includes an LC tank 515. With the arrangement shown, by appropriate control of the number of coupled transconductor slices 510, VCO 500 may continue to oscillate at a desired operating frequency while realizing efficient low power operation. To this end, the output signal of VCO 500 (which may be a given clock signal CLK) is further coupled to a peak detection circuit 530. Peak detection circuit 530 may operate to compare this output signal to one or more thresholds to identify a signal swing of the output signal. Based at least in part on the determined amplitude, peak detector 530 is configured to provide one or more control signals (e.g., 0:N) to a plurality of transconductor slices 510 (e.g., N+1 slices) to selectively control them to be coupled to or decoupled from VCO 500.

With the arrangement of FIG. 5, when the loss of tank 515 increases in some corner, or the transconductance of transconductor 510 decreases, the startup gain of VCO 500 decreases and the output swing is lowered. Detection circuit 530 is thus configured to sense the swing of the VCO output. In response to detection of the output swing, the amount of transconductance that can be achieved may be adjusted, e.g., by coupling or decoupling one or more controllable transconductor slices 510.

As will be described further, different control techniques are possible. In an embodiment, peak detection circuit 530 may include hardware circuitry (such as peak detector and microcontroller), software, firmware and/or combinations thereof, such as programmable logic to execute instructions to determine, based at least in part on an amplitude of the output signal an appropriate number and selection of which transconductor slices to enable. In some cases, this programmable logic may include or be associated with a lookup table having entries that may be accessed based on a given amplitude of the output signal to identify a control code that may include multiple bits, one or more of which is used to selectively enable or disable a given transconductor slice. Understand while shown at this high level in the embodiment of FIG. 5, many variations and alternatives are possible.

Figure 6:
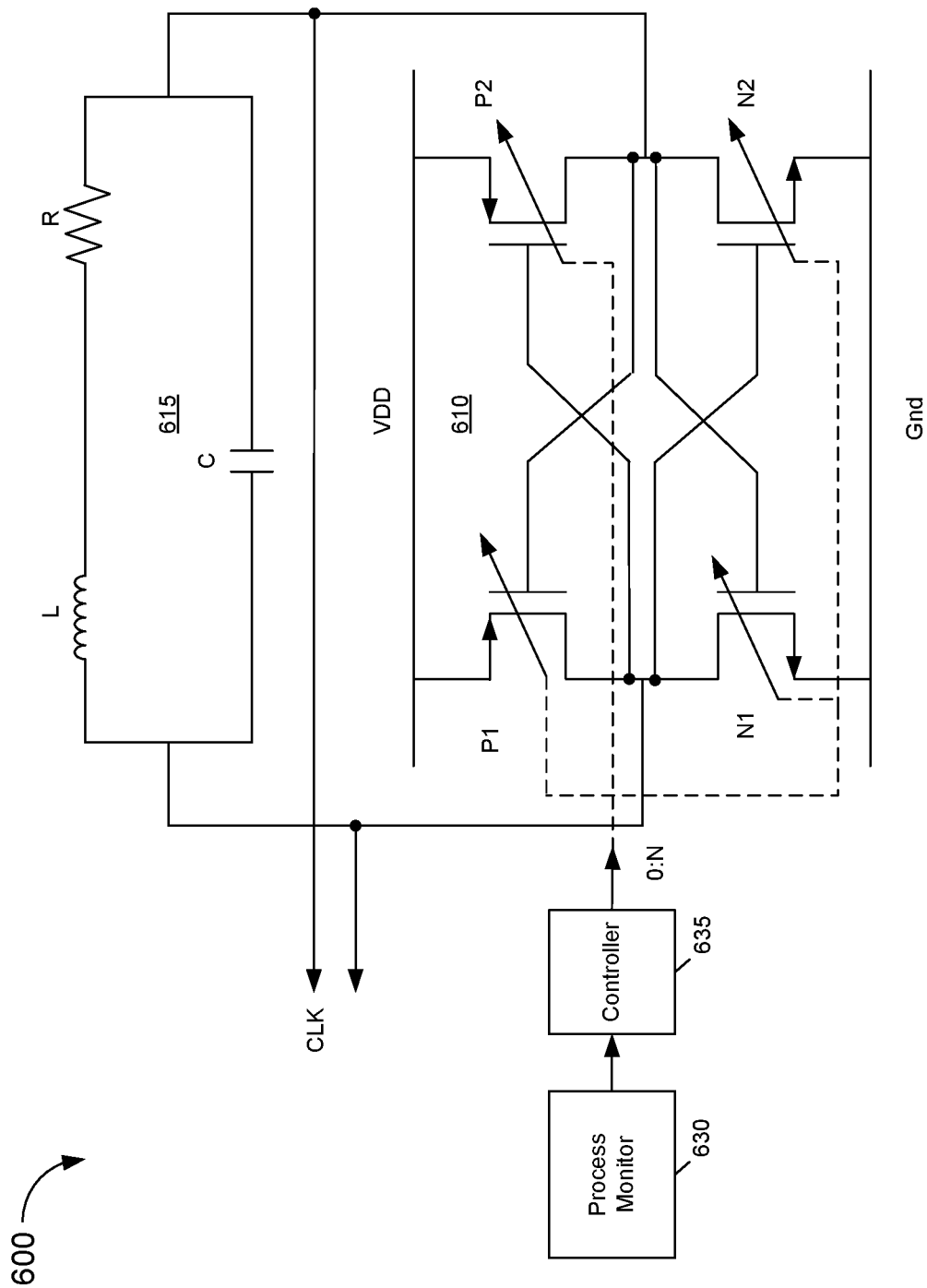
FIG. 6 is a schematic diagram of another embodiment for controlling a transconductor in accordance with an embodiment.

Referring now to FIG. 6, shown is a schematic diagram of another embodiment for controlling a transconductor in accordance with an embodiment. More specifically, in FIG. 6, VCO 600 is adapted similarly to VCO 500 of FIG. 5. However, in this embodiment instead of a peak detection circuit, VCO 600 includes a process monitor 630 configured to determine a process of the associated IC. In different embodiments, process monitor 630 may be implemented as a dedicated circuit within the IC to measure process variation. In an example embodiment, process monitor 630 may include a ring oscillator to generate an oscillation frequency and a detector to measure the oscillation frequency (note that this ring oscillator is a separate structure of the IC, independent from VCO 600). In other cases, thermal monitors may be included in process monitor 630, along with other types of process monitors. In still other cases, process monitor 630 may include a circuit to measure actual threshold voltages of transistors, such as NMOS and PMOS devices. In this way, based on this measurement of threshold voltage, process monitor 630 can identify a given IC as being of a fast process, slow process or typical process. As an example, process monitor 630 may compare detected threshold voltages to typical (nominal) threshold voltages for fast, typical and slow process devices to identify process type.

In some cases, process monitor 630 may detect a given process variation such as during manufacturing testing so that transconductor and other control of a VCO as described herein may be fixed such as by way of control codes programmed into the IC during manufacture. In other cases, dynamic-based process monitoring may be performed.

In any case, the output of process monitor 630, which provides an indication of the type of process corner (e.g., slow, fast or typical) and/or temperature is provided to a controller 635. In turn controller 635 may to provide one or more control signals (e.g., 0:N) to a plurality of transconductor slices 610 (e.g., N+1 slices) to selectively control them to be coupled to or decoupled from VCO 600. Understand while shown at this high level in the embodiment of FIG. 6, many variations and alternatives are possible.

Figure 7:
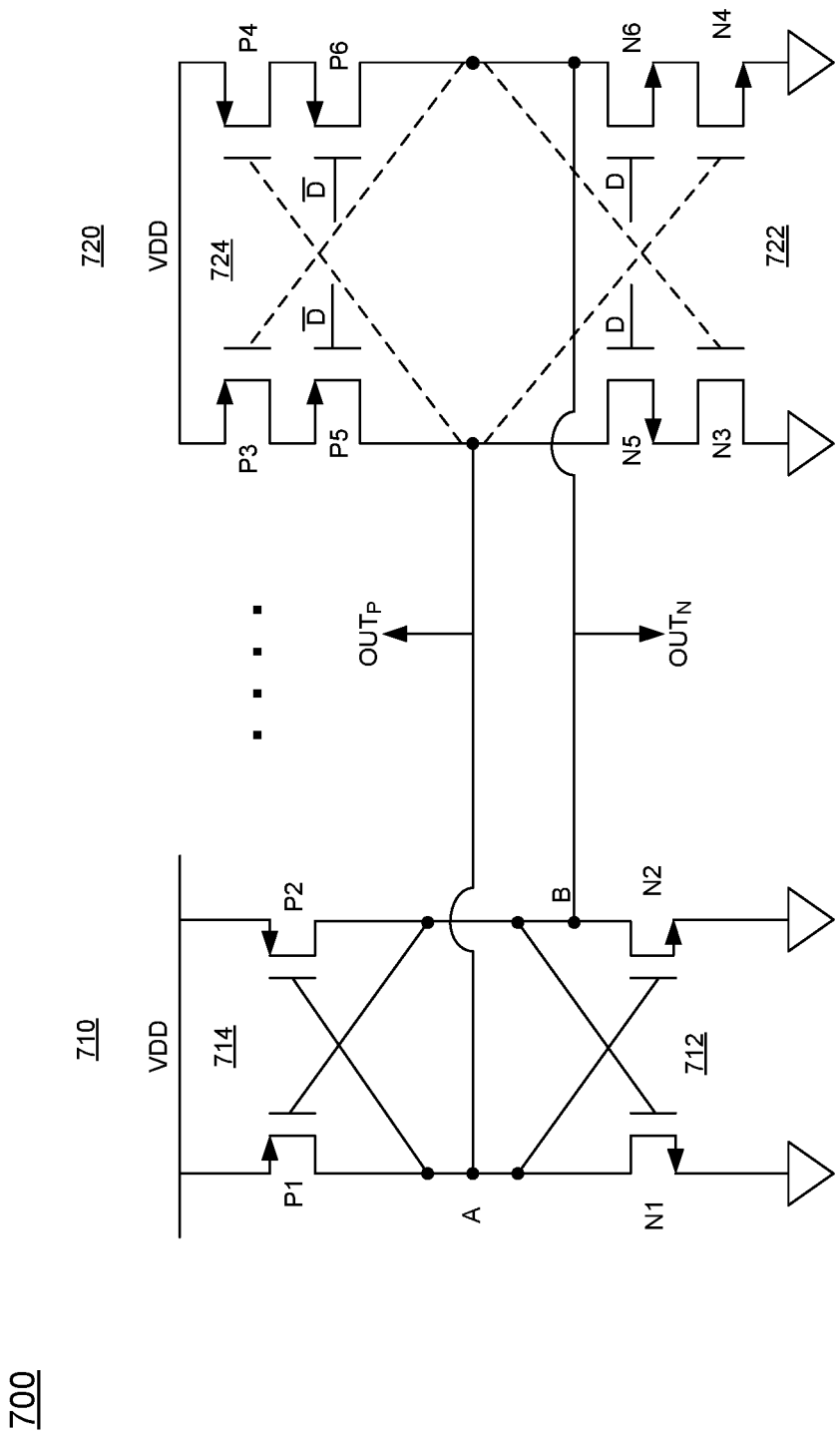
FIG. 7 is a schematic diagram of a transconductor implementation in accordance with an embodiment.

Referring now to FIG. 7, shown is a schematic diagram of a transconductor implementation in accordance with one embodiment. As shown in FIG. 7, transconductor 700 includes multiple slices, namely a first transconductor 710 and a second transconductor 720 (which may be one of multiple controllable transconductor slices). In the embodiment shown, transconductor 710 is a fixed transconductor such that it is always coupled to a VCO (not shown for ease of illustration in FIG. 7). Instead, transconductor 720 is implemented as a controllable or switchable transconductor such that it may be controllably switched into or out of a VCO as desired for a particular operating state. More specifically, transconductor 720 can dynamically be coupled to the VCO via control of cascode devices. Instead by alternate control these cascode devices, transconductor 720 may be decoupled from the VCO.

As illustrated, transconductor 710 includes cross-coupled MOSFET pairs, namely an NMOS pair 712 formed of NMOS devices N1 and N2 and a PMOS pair 714 formed of PMOS devices P1 and P2. More specifically with this arrangement, transconductor 710, in response to its coupling to a supply voltage VDD and GND, outputs energy in the form of current to the VCO. Note that the inter-pair nodes A and B of transconductor 710 couple to corresponding output nodes of the VCO that output the oscillating output signal, namely a differential signal OUTp and OUTn.

Similarly, transconductor 720 includes cross-coupled MOSFET pairs, namely an NMOS pair 722 formed of NMOS devices N3 and N4 and a PMOS pair 724 formed of PMOS devices P3 and P4. These devices of transconductor 720 can be dynamically controlled by cascode switches to be selectively coupled or decoupled with respect to the VCO. More specifically, for NMOS pair 722, NMOS cascode devices N5 and N6 are connected in series and for PMOS pair 724, PMOS cascode devices P5 and P6 are connected in series. Depending on the amount of transconductance needed to achieve a certain swing at the output of the VCO, the number of transconductor slices to be turned on can be adjusted. In this way, additional transconductance is only added in corners where the transconductance drops or loss in the tank increases. This saves additional power consumption in typical corner devices. Note that the cascode switches coupled in series only slightly increase the capacitance on the output node, and in some cases this capacitance can be compensated in the fixed capacitance of VCO 700. In an embodiment, fixed transconductor 710 may provide a given transconductance, and the inclusion of controllable transconductor slices 720 may be used to boost the energy delivered to the tank by, e.g., 50%.

Figure 8:
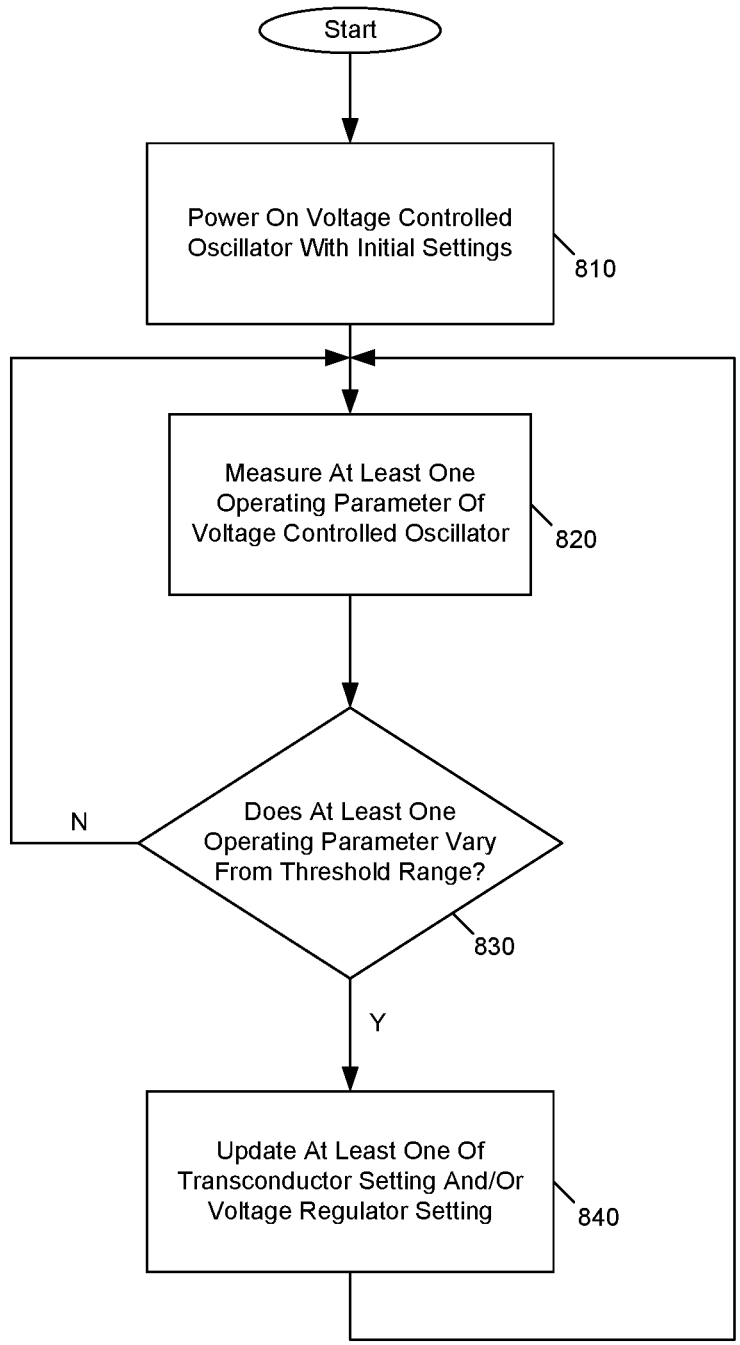
FIG. 8 is a flow diagram of a method in accordance with an embodiment.

Referring now to FIG. 8, shown is a flow diagram of a method in accordance with an embodiment. More specifically, method 800 illustrates operation of a VCO as described herein. In some embodiments, method 800 may be performed using control logic such as a microcontroller or other processing circuitry that is configured to detect an amplitude or other operating parameters of the VCO and provide appropriate control to the VCO to maintain a desired level of operation. Such control may include coupling or decoupling of transconductor slices as described herein, as well as appropriate control of a voltage regulator that provides an operating voltage to the VCO. Of course while these particular control techniques are described herein, understand that additional controllable parameters associated with a VCO can be monitored and used to dynamically control the VCO in other embodiments.

As illustrated, method 800 begins by powering on a VCO with initial settings (block 810). For a given VCO that is to operate at a particular operating frequency (such as a VCO that is to provide a clock signal for use in a given integrated circuit, such as a Wi-Fi chip), these initial parameters (e.g., an operating voltage and a capacitance level) can be used to generate the oscillating signal at the desired frequency. Still with reference to FIG. 8, control next passes to block 820 where at least one operating parameter of the VCO is measured. In different embodiments as described herein one operating parameter that may be measured is an output swing or amplitude of the oscillating signal. Other operating parameters, such as process monitoring information, temperature or so forth also may be used. Alternately, the PMOS and NMOS ratio can be skewed by only turning on additional PMOS or NMOS devices to improve flicker noise corner, since flicker noise corner depends on the ratio of PMOS strength to NMOS strength. In an embodiment, this ratio can be measured and adjusted via a lab one-time adjustment.

Still with reference to FIG. 8, control next passes to diamond 830 to determine whether at least one of these operating parameters varies from a threshold range. For example, with regard to output swing, a VCO may be provided with a tolerance level (e.g., min to max) as well as nominal specifications. Thus in such case this determination at diamond 830 identifies whether the voltage swing falls below the minimum level or exceeds the maximum level. If this is the case, control passes to block 840 where at least one setting of the transconductor and/or the voltage regulator can be updated. For example, one or more additional transconductor slices may be coupled into the VCO when the voltage swing falls below a threshold level (e.g., a minimum threshold level). Similarly, should the voltage swing exceed a maximum level, one or more transconductor slices may be decoupled from the VCO. In some embodiments additionally or instead of transconductor control, a voltage regulator output can be dynamically adjusted. In some cases, this adjustment may occur by way of a replica circuit of the voltage regulator that thus tracks VCO operation and automatically controls output voltage of the voltage regulator accordingly. Understand while shown at this high level in the embodiment of FIG. 8, understand that many variations and alternatives are possible.

Figure 9:
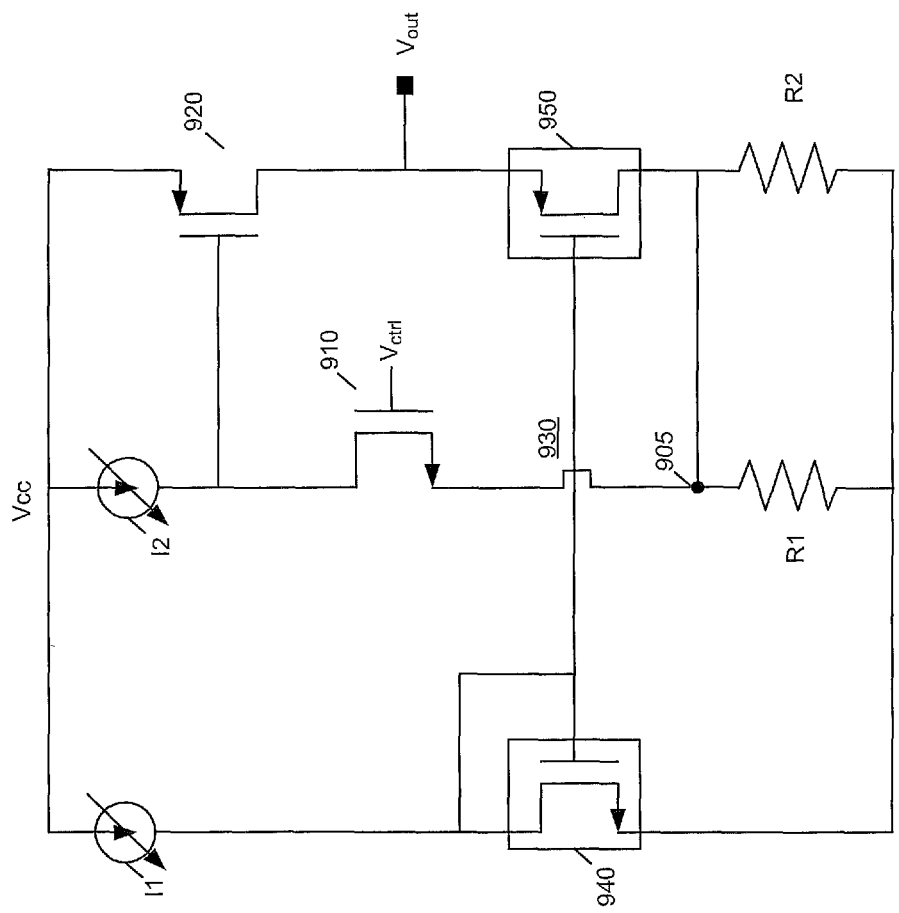
FIG. 9 is a schematic diagram of a voltage regulator in accordance with an embodiment.

Referring now to FIG. 9, shown is a schematic diagram of a voltage regulator in accordance with an embodiment. As shown in FIG. 9, voltage regulator 900 may be an on-chip regulator to provide a regulated voltage to a VCO as described herein. As discussed above, in some cases it is possible to provide an adjustable voltage to the VCO based at least in part on one or more of process, voltage and temperature. Regulator 900 may be co-designed with the VCO such that the output of the regulator (like a replica circuit) is boosted in corners where the threshold voltages of the devices increase and cause the negative gm available from the transconductor to drop.

As illustrated, regulator 900 is coupled to receive an incoming supply voltage (Vcc). Voltage regulator 900 includes controllable current sources I1 and I2. In an embodiment, trim bits can be used to control number the total number of PMOS current sources providing I1 and I2. To provide a desired output voltage, a control signal, Vctrl, is applied to an NMOS device 910 having a gate terminal coupled to receive this control signal, a drain terminal coupled to current source I2 and a source terminal that couples to an inter-resistor node 905 coupled to resistors R1 and R2. As further shown, a PMOS device 920 has a gate terminal coupled to the drain terminal of NMOS device 910 and current source I2 and a drain terminal coupled to an output voltage node that provides an output voltage Vout. This output voltage is in turn provided as a supply voltage to the VCO (in addition to potentially other on-chip circuitry).

To provide controllability as described herein, voltage regulator 900 may further include replica circuit 930 formed of an NMOS device 940 and a PMOS device 950. Note that these devices are coupled in a current mirror configuration with NMOS device 940 having a drain terminal coupled to current source I1 (and commonly coupled with its gate terminal) and a source terminal coupled to a reference voltage node. In turn, PMOS device 950 has a commonly coupled gate terminal with the gate terminal of NMOS device 940, a drain terminal coupled to inter-resistor node 905 and a source terminal that couples to the output voltage node. Note that replica circuit 930 may be formed with these NMOS and PMOS devices that are sized to replicate variations in the output swing of the VCO such that changes in the threshold voltage of these devices over PVT similarly lead to changes in the output voltage generated by voltage regulator 900.

In the embodiment of FIG. 9, the output voltage is according to: $Vout=VTn+VONn+VTp+VONp$, where VTn and VTp are the threshold voltages of NMOS device 940 and PMOS device 950, and VONn and VONp are the on voltages of NMOS device 910 and PMOS device 920. With this arrangement, in a slow process corner device the output voltage of regulator 900 increases as VTn and VTp increase and therefore provides more headroom for the transconductor arrangement, which in turn increases the energy transfer to the LC tank. The opposite happens in a fast corner device, namely the output voltage of regulator 900 is reduced. Note that the presence of VONp and VONn in the output voltage reduces the amount of tracking across temperature.

In some cases, changing losses and transconductance can be controlled by providing programmability to the regulator output voltage through controllable current sources I1 and I2, and trimming the output voltage based at least in part on the detected output swing of the VCO.

Figure 10:
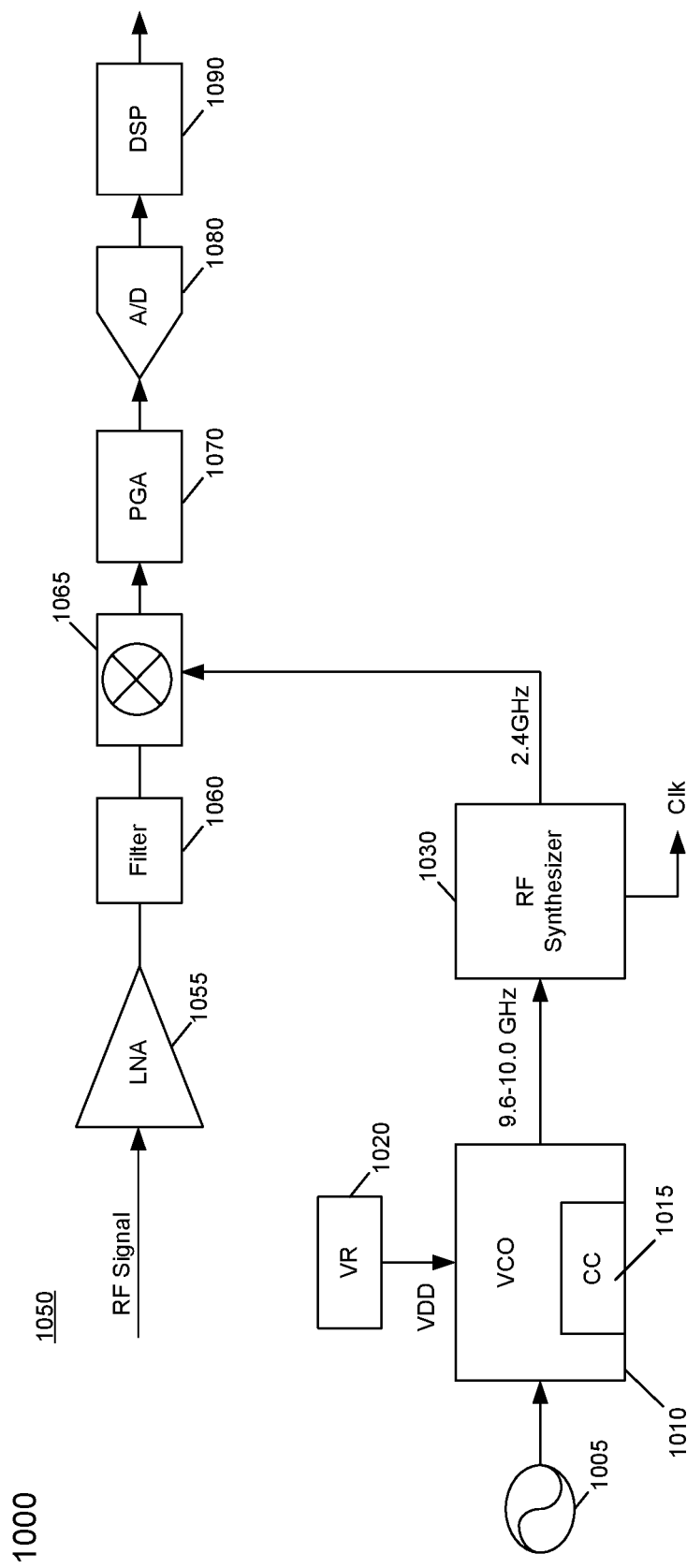
FIG. 10 is a block diagram of an integrated circuit including a controllable VCO as described herein.

Referring now to FIG. 10, shown is a block diagram of an integrated circuit including a controllable VCO as described herein. More specifically as illustrated in FIG. 10, integrated circuit 1000 is a representative wireless transceiver such as a WiFi transceiver that may be used in many different types of applications. Of interest here, note that IC 1000 includes a VCO 1010 in turn including a control circuit 1015. In embodiments, control circuit 1015 may be used to dynamically control an amount of transconductance that is switched into and out of an LC tank of VCO 1010 to provide a controllable amount of transconductance to the LC tank. In addition, IC 1000 includes a voltage regulator 1020. Voltage regulator 1020 provides a supply voltage (e.g., VDD) to VCO 1010 (and potentially to other portions of IC 1000). As described herein in some cases voltage regulator 1010 may provide a dynamically controllable voltage to further control operation in VCO 1010.

In the embodiment shown, VCO 1010 receives a clock signal from a clock source 1005 (which in some cases may be an off-chip clock source). In turn, VCO 1010 generates a clock signal at a given operating frequency (e.g., between approximately 9.6-10.0 GHz in one embodiment). This clock signal in turn is provided to an RF synthesizer 1030 that may generate one or more clock signals for use within IC 1000. Of interest here, a divided version of the input clock signal (e.g., at 2.4 GHz) is provided to a mixer 1065 of a signal processing path 1050 of IC 1000.

As shown, signal processing path 1050 includes a low noise amplifier (LNA) 1055 to receive and condition an incoming RF signal. This conditioned signal in turn is provided to a filter 1060 that may perform filtering on the incoming RF signal that is then provided to mixer 1065.

Mixer 1065 is configured to downconvert the incoming RF signal to a lower frequency signal (e.g., a baseband or low intermediate frequency signal) using this mixing signal output by RF synthesizer 1030. The downconverted signal is provided to a programmable gain amplifier (PGA) 1070 and in turn to an analog-to-digital (ADC) converter 1080 for digitization. The resulting digitized signal is provided to a digital signal processor 1090 that in turn may further process the incoming signal. Note that this digitized processed signal can be provided to appropriate processing circuitry (e.g., a microcontroller within IC 1000 or one or more other devices of an application in which IC 1000 is used).

In a representative embodiment, the processed signals output by DSP 1090 can be provided to another integrated circuit, such as a microcontroller or other programmable circuitry that may process the signals accordingly. As an example, an Internet of Things (IoT) device including a wireless transceiver such as a sensor, monitor or so forth, can be used to measure information or provide user input and communicate such user input via a transmit signal processing path of integrated circuit 1000 (not shown for ease of illustration in FIG. 10). In turn, these IoT-communicated signals can be received by another device such as a hub device within a given IoT system, which may in turn communicate the signals, via a central hub computer or so forth, to an Internet-based destination such as a server.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus comprising:
   a voltage controlled oscillator (VCO) to output an oscillating signal, the VCO having:
   a tank formed of at least one capacitor coupled in parallel with at least one inductor; and
   a plurality of transconductors to provide energy to the tank, at least one of the plurality of transconductors to be controllably switched to be coupled to the tank or to be decoupled from the tank; and
   a voltage regulator coupled to provide an operating voltage to the VCO, wherein the voltage regulator dynamically adjusts the operating voltage based, at least in part, on a sum of threshold voltages of complementary transistors that are included within the voltage regulator to track a process corner of the VCO;
   wherein the voltage regulator comprises a replica circuit to track the process corner of the VCO, wherein the replica circuit comprises an N-channel metal oxide semiconductor (NMOS) transistor and a P-channel MOS (PMOS) transistor coupled in a current mirror configuration, and wherein the voltage regulator dynamically adjusts the operating voltage provided to the VCO based, at least in part, on a sum of threshold voltages of the NMOS transistor and the PMOS transistor.

2. The apparatus of claim 1, wherein the plurality of transconductors comprises at least one fixed transconductor fixably coupled to the tank.

3. The apparatus of claim 1, further comprising a detection circuit coupled to receive the oscillating signal, wherein the detection circuit controls switching of the at least one switchable transconductor based, at least in part, on at least one operating parameter of the oscillating signal.

4. The apparatus of claim 3, wherein the detection circuit is to cause the at least one switchable transconductor to be coupled to the VCO when a swing of the oscillating signal is less than a threshold.

5. The apparatus of claim 1, further comprising:
   a process monitor coupled to measure at least one of a process, a voltage and a temperature of the apparatus; and a controller coupled to control switching of the at least one switchable transconductor based, at least in part, on the process, the voltage and/or the temperature measured by the process monitor.

6. The apparatus of claim 1, wherein the at least one switchable transconductor comprises:
a first pair of cross-coupled transistors;
a second pair of cross-coupled transistors;
at least one first switch to controllably couple or decouple the first pair of cross-coupled transistors with respect to the VCO; and
at least one second switch to controllably couple or decouple the second pair of cross-coupled transistors with respect to the VCO.

7. The apparatus of claim 6, wherein:
the at least one first switch comprises a first pair of cascodes coupled to the first pair of cross-coupled transistors; and
the at least one second switch comprises a second pair of cascodes coupled to the second pair of cross-coupled transistors.

8. The apparatus of claim 6, wherein the at least one first switch and the at least one second switch are independently controlled.

9. A method comprising:
measuring at least one operating parameter of a voltage controlled oscillator (VCO);
in response to the at least one operating parameter varying from a threshold range, coupling at least one controllable transconductor slice to the VCO; and
dynamically controlling an output voltage of a voltage regulator coupled to the VCO in response to the at least one operating parameter varying from the threshold range, wherein said dynamically controlling the output voltage comprises adjusting the output voltage based, at least in part, on a sum of threshold voltages of complementary transistors that are included within the voltage regulator to track a process corner of the VCO;
wherein the voltage regulator comprises a replica circuit configured to track the process corner of the VCO, wherein the replica circuit comprises an N-channel metal oxide semiconductor (NMOS) transistor and a P-channel MOS (PMOS) transistor coupled in a current mirror configuration, and wherein said dynamically controlling the output voltage of the voltage regulator comprises dynamically adjusting the output voltage based, at least in part, on a sum of threshold voltages of the NMOS transistor and the PMOS transistor.

10. The method of claim 9, further comprising accessing a table based at least in part on a swing of an output signal of the VCO to obtain a control code from the table.

11. The method of claim 10, further comprising controlling one or more switches of the at least one controllable transconductor slice based on the control code to couple the at least one controllable transconductor slice to the VCO.

12. The method of claim 9, further comprising decoupling the at least one controllable transconductor slice from the VCO in response to the at least one operating parameter being within the threshold range.

13. The method of claim 9, further comprising maintaining a fixed transconductor slice coupled to the VCO, regardless of a value of the at least one operating parameter.

14. The method of claim 9, wherein coupling the at least one controllable transconductor slice comprises:

controlling at least one first switch of the at least one controllable transconductor slice to couple a first cross-coupled pair of transistors of the at least one controllable transconductor slice to the VCO; and
controlling at least one second switch to maintain a second cross-coupled pair of transistors of the at least one controllable transconductor slice decoupled from the VCO.

15. The method of claim 9, further comprising:
measuring at least one of a process, a voltage and a temperature of a system or apparatus comprising the VCO; and
controlling coupling of the at least one controllable transconductor slice to the VCO based on the measured process, voltage and/or temperature.

16. A system comprising:
an amplifier to receive a radio frequency (RF) signal and amplify the RF signal;
a mixer to downconvert the amplified RF signal to a second frequency signal according to a mixing signal;
a digitizer to digitize the second frequency signal into a digitized signal;
a signal processor to process the digitized signal;
a voltage controlled oscillator (VCO) to output an oscillating signal, the mixing signal based on the oscillating signal, the VCO comprising:
a tank formed of at least one capacitor coupled in parallel with at least one inductor; and
a plurality of transconductors to provide energy to the tank, at least one of the plurality of transconductors to be switchably coupled to the tank or decoupled from the tank based, at least in part, on one or more of a process corner of the system and an operating parameter of the VCO; and
a voltage regulator coupled to provide an operating voltage to the VCO, wherein the voltage regulator comprises a replica circuit to track the process corner of the system, wherein the replica circuit comprises an N-channel metal oxide semiconductor (NMOS) transistor and a P-channel MOS (PMOS) transistor coupled in a current mirror configuration, and wherein the voltage regulator dynamically adjusts the operating voltage provided to the VCO based, at least in part, on a sum of threshold voltages of the NMOS transistor and the PMOS transistor.

17. The system of claim 16, further comprising a detection circuit coupled to receive the oscillating signal, wherein the detection circuit detects the operating parameter of the VCO and controls switching of the at least one transconductor based on the detected operating parameter of the VCO.

18. The system of claim 16, further comprising:
a process monitor coupled to measure at least one of the process corner of the system, a voltage and a temperature; and
a controller coupled to control switching of the at least one switchable transconductor based on the process corner, voltage and/or temperature measured by the process monitor.

* * * * *